United States Patent [19]

Motohama et al.

[11] Patent Number: 5,901,154
[45] Date of Patent: May 4, 1999

[54] METHOD FOR PRODUCING TEST PROGRAM FOR SEMICONDUCTOR DEVICE

[75] Inventors: Masayuki Motohama, Takatsuki; Junichi Hirase, Nagoakakyo; Akihiko Watanabe; Michio Maekawa, both of Takatsuki, all of Japan

[73] Assignee: Matasushita Electric Industrial Co., Ltd., Osaka-Fu, Japan

[21] Appl. No.: 08/873,688

[22] Filed: Jun. 12, 1997

[30] Foreign Application Priority Data

Jun. 14, 1996 [JP] Japan ................................. 8-153941

[51] Int. Cl.⁶ .................................................. G06F 11/00
[52] U.S. Cl. .......................................... 371/22.1; 364/488
[58] Field of Search ........................... 371/22.1, 28, 27.1, 371/22.33, 22.6, 27.4; 395/183.14, 183.02, 183.22, 708, 181, 183.13, 185.04; 364/488, 489, 490, 550, 579, 580

[56] References Cited

U.S. PATENT DOCUMENTS

| | | | |
|---|---|---|---|
| 5,235,271 | 8/1993 | Kira | 324/158 R |
| 5,282,146 | 1/1994 | Aihara et al. | 364/489 |
| 5,581,491 | 12/1996 | Biwer et al. | 364/580 |
| 5,629,878 | 5/1997 | Kobrosly | 364/579 |
| 5,729,676 | 3/1998 | Inoue | 395/183.14 |
| 5,754,755 | 5/1998 | Smith, Jr. | 395/183.14 |
| 5,761,408 | 6/1998 | Kolawa et al. | 395/183.14 |

*Primary Examiner*—Robert W. Beausoliel, Jr.
*Assistant Examiner*—Nadeem Iqbal
*Attorney, Agent, or Firm*—Sheridan Ross P.C.

[57] ABSTRACT

The invention relates to a method for reducing the time required to test the functions of a semiconductor device. Test modules, each having a plurality of test statements, are created for testing predetermined functions of the device. Common test statements are extracted from the test modules. A test program is then produced by sequentially arranging the extracted statement(s) and the remaining statements from the test modules.

18 Claims, 18 Drawing Sheets

FIG. 14 TEST MODULES (I) GROUPED USING LEVEL CONDITION

METHOD FOR PRODUCING TEST PROGRAM FOR SEMICONDUCTOR DEVICE

BACKGROUND OF THE INVENTION

The present invention relates an improvement a method for producing a program for functional test of a semiconductor device (hereinafter referred to as "test program").

In general, when a function of a semiconductor device is to be tested, the semiconductor device is operated in accordance with contents of a test program, thereby to determine whether it outputs expected data or not. From the result of output, whether the semiconductor device is good or not is judged. However, since a semiconductor device has various types of functions, testing of all functions requires one to prepare a test program for respective ones of the functions and then to execute the test programs in a predetermined order. The functional tests of a semiconductor device are, for example, a test of a read only memory (ROM), a test of a random access memory (RAM), a test of an operation, etc.

A method of making a conventional test program will be elucidated in detail referring to FIG. 18.

FIG. 18 shows a configuration of a conventional test program for testing a semiconductor device. The test program includes a pattern program (not shown) and test items. The pattern program includes combination of an input signal and an output signal which is an expected value. The input signal and the output signal are both in configured. The test items are a test item A, a test item B, a test item C, - - - . The test items are each a combination of a plurality of test statements for executing a functional test of a semiconductor device. A user makes the test items by combining the test statements. When a group of test items which contain the plurality of test statements are combined with the pattern program, functional tests of the semiconductor device can be executed.

The functions of the semiconductor device are tested in accordance with the contents of the test programs and whether the semiconductor device is good or not is judged. Hence, if a user will make a test item using a wrong test statement, the functional test of the semiconductor device will fail, and therefore, a wrong judgement will be made if the semiconductor device is good.

In addition, there are some cases where that an unnecessary test statement is executed during testing of the functions of the semiconductor device. For example, even when a statement regarding level condition setting is the same both for the test items A and for C but a level condition setting statement for the test item B is different, the level condition setting statement is executed three times. Such multiple time executions are problematic, since such multiple time executions extend time for the functional tests of the semiconductor device.

BRIEF SUMMARY OF THE INVENTION

An object of the present invention is to provide an improved method for producing a test program for all functional tests of a semiconductor device in a short period of time.

The method comprises the steps of:

extracting a test statement which is common among test items which the test items includes a plurality of test statement by a processor, and making a test program by sequentially arranging the extracted test statement and other test statements except for the extracted test statement in the order of the test items by the processor.

According to the present invention, a test statement which is common among the test items is executed a reduced number of times. Hence, a time which is needed for the functional tests of the semiconductor device is shortened.

The above-mentioned method further comprises the steps of:

further extracting a test statement which is common among the test statements other than the extracted test statement by the processor.

According to the foregoing, when a test item is formed by a number of test statements, it is possible to further shorten a time which is needed for functional tests of the semiconductor device.

The method comprises the steps of;

grouping test items which contain common test statement which the test items includes a plurality of test statement by a processor, extracting a test statement which is common among the grouped test items by the processor, and making a test program by sequentially arranging the extracted test statement, other test statements except for the extracted test statement in the order of the grouped test items and the test statements in the order of the test items excluding the grouped test items by the processor.

According to the present invention, a common test statement is extracted only from the test items which contain the common test statement. Hence, a time which is needed for functional tests of the semiconductor device is shortened.

The above-mentioned method further comprises the steps of:

further grouping test items which contain common test statement at the grouped test items by the processor, and further extracting a test statement which is common among the test statements other than the extracted test statement at the further grouped test items by the processor.

According to the foregoing, when a test item is formed by a number of test statements, it is possible to further reduce a time which is needed for functional tests of the semiconductor device.

A readable recording medium stores a program which comprises the steps of:

extracting a test statement which is common among test items which the test items includes a plurality of test statement, and making a test program by sequentially arranging the extracted test statement and other test statements except for the extracted test statement in the order of the test items.

According to the present invention, since the program is recorded in a readable recording medium, it is possible to test functions of a semiconductor device while utilizing a computer system which is not connected in a network or the like.

A readable recording medium stores a program which comprises of the steps of:

grouping test items which contain common test statement which the test items includes a plurality of test statement, extracting a test statement which is common among the grouped test items, and making a test program by sequentially arranging the extracted test statement, other test statements except for the extracted test statement in the order of the grouped test items and the test statements in the order of the test items excluding the grouped test items.

According to the present invention, since the program is recorded in a readable recording medium, it is possible to test functions of a semiconductor device while utilizing a computer system which is not connected in a network or the like.

DETAILED DESCRIPTION OF THE INVENTION

Figure 1:
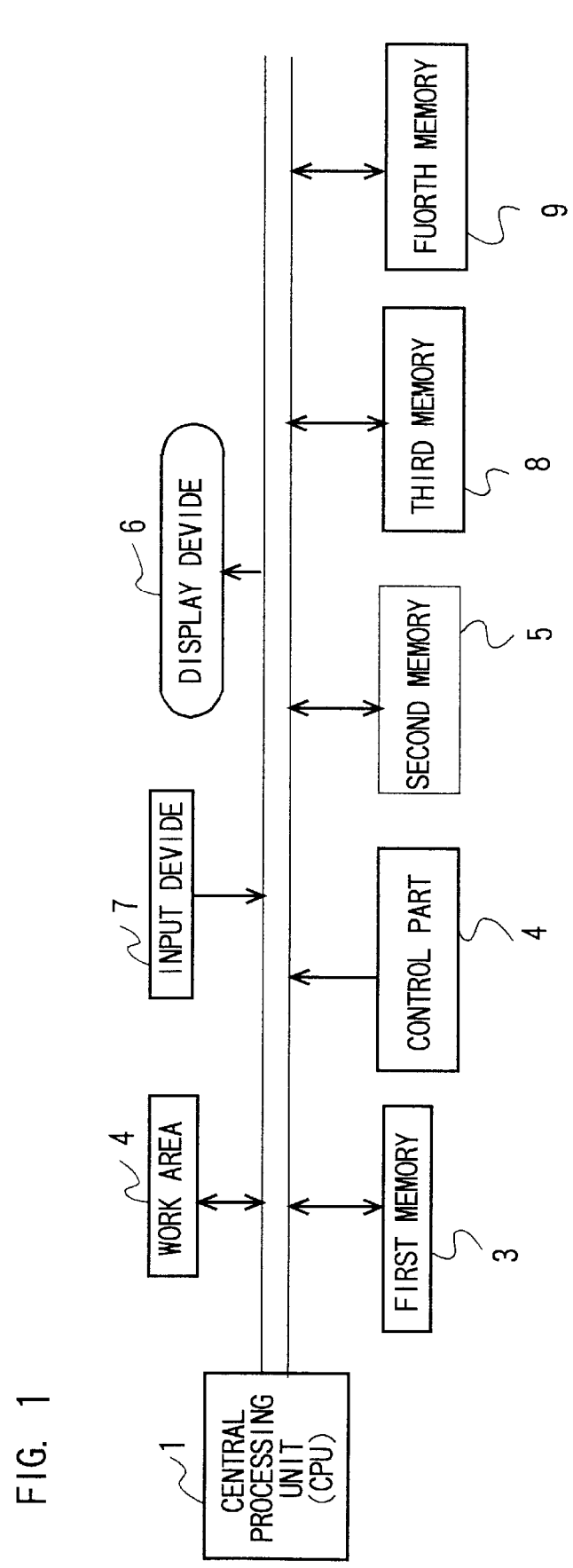
FIG. 1 is a diagram showing a system for making a test program.

Preferred Embodiments in accordance with the present invention will be elucidated referring to the drawings.

Embodiment 1

A method for producing a test program according to Embodiment 1 of the present invention will be elucidated in detail referring to FIGS. 1 to 16.

FIG. 1 shows a structure of a system which makes a test program.

This system includes a central processing unit (CPU) 1, a control unit 2, a first memory 3, a work area 4, a second memory 5, a display device 6, an input device 7, a third memory 8, and a fourth memory 9.

The CPU 1 is for executing the processing for making of a test program. The control unit 2 is for controlling the CPU 1 and for making the CPU 1 execute the processing. The first memory 3 is for storing procedures of making the test program. The work area 4 is an area which is used by CPU 1 to execute the processing. The second memory 5 is for storing a plurality of test statements. The test statements are, for instance, a BIN number setting statement, a level condition setting statement, a timing condition setting statement, a pin condition setting statement, a measure statement, a judgement statement, a post-processing statement, etc.

BIN numbers related to the BIN number setting statement are used for the convenience of classifying functional tests of a semiconductor device.

The display device 6 is for displaying the test statements which are stored in the second memory 5. The display device 6 is a display, for example. The input device 7 is used to select a test statement from test statements which are displayed in the display device 6. The input device 7 is a key board, for instance. The third memory 8 is for storing a plurality of test items (hereinafter referred to as "test module") which are formed of test statements input through the input device 7. The fourth memory 9 is for storing a test program which is made from the test modules stored in the third memory 8, in accordance with procedures which are stored in the first memory 3.

A process in which a system having the structure described above makes the test program will be elucidated.

The display device 6 displays the test statements which are stored in the second memory 5. Using the input device 7, an operator makes a plurality of test modules as those shown in FIGS. 2, 6 and 12 from the test statements which are displayed in the display device 6. The plurality of test modules made by the operator are stored in the third memory 8.

After the test modules made by the operator are stored in the third memory 8, the control unit 2 controls the CPU 1. Under the control of the control unit 2, the CPU 1 makes the test program utilizing the work area 4 in accordance with the procedures which are stored in the first memory 3. The test program which was made by the CPU 1 is stored in the fourth memory 9.

In the following, the process in which the CPU 1 makes the test program in accordance with the procedures stored in the first memory 3 is elucidated in detail.

Process Of Making A Test Program 1

Figure 2:
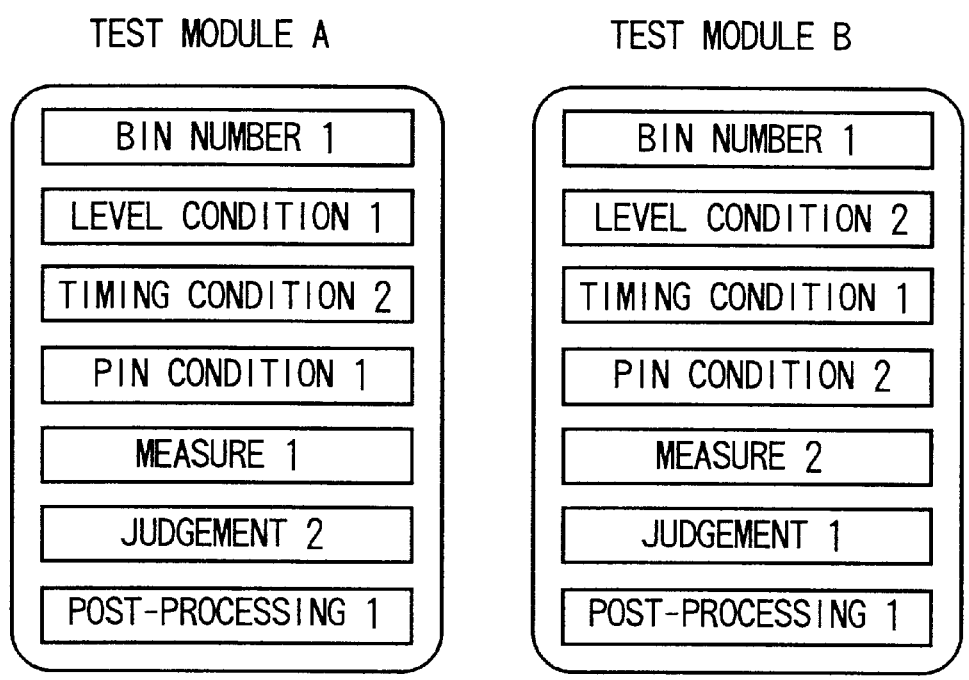
FIG. 2 is a diagram showing a test module containing a plurality of test statements as it is at process of making a test program 1.

A description will be given on a case where a test module A and a test module B which are made by an operator and stored in the third memory 8 are as shown in FIG. 2.

The test module A includes BIN Number 1, Level Condition 1, Timing Condition 2, Pin Condition 1, Measure 1, Judgement 2, and Post-Processing 1. The test module B includes BIN Number 1, Level Condition 2, Timing Condition 1, Pin Condition 2, Measure 2, Judgement 1, and Post-Processing 1.

BIN Number 1 is the BIN number setting statement, and more precisely, is an example of the BIN number setting statement. Level Condition 1 and Level Condition 2 are the level condition setting statement, and more precisely, are examples of the level condition setting statement. Timing Condition 1 and Timing Condition 2 are the timing condition setting statement, and more precisely, are examples of the timing condition setting statement. Pin Condition 1 and Pin Condition 2 are the pin condition setting statement, and more precisely, are examples of the pin condition setting statement. Measure 1 and Measure 2 are the measure statement, and more precisely, are examples of the measure statement. Post-Processing 1 and Post-Processing 2 are the post-processing statement, and more precisely, are examples of the post-processing command. This will remain the same in the description hereinafter given in relation to "Process Of Making A Test Program 2 " and "Process Of Making A Test Program 3 ".

The test module A and the test module B are examples of the test module.

Figure 3:
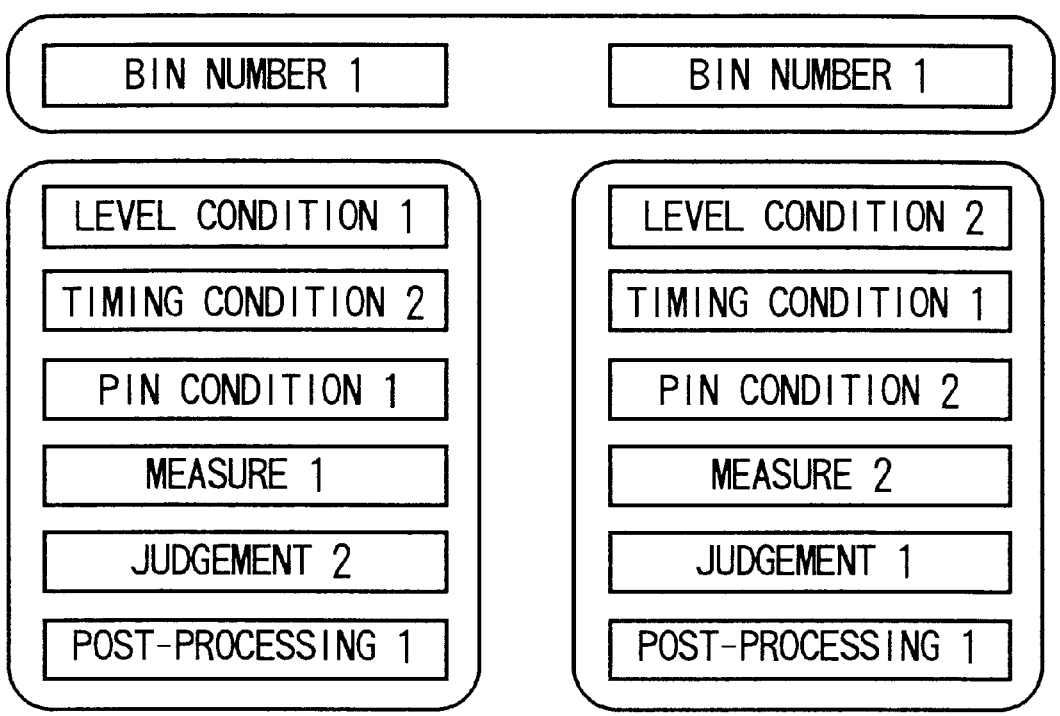
FIG. 3 is a diagram showing processes of making the test program at process of making a test program 1.
Figure 4:
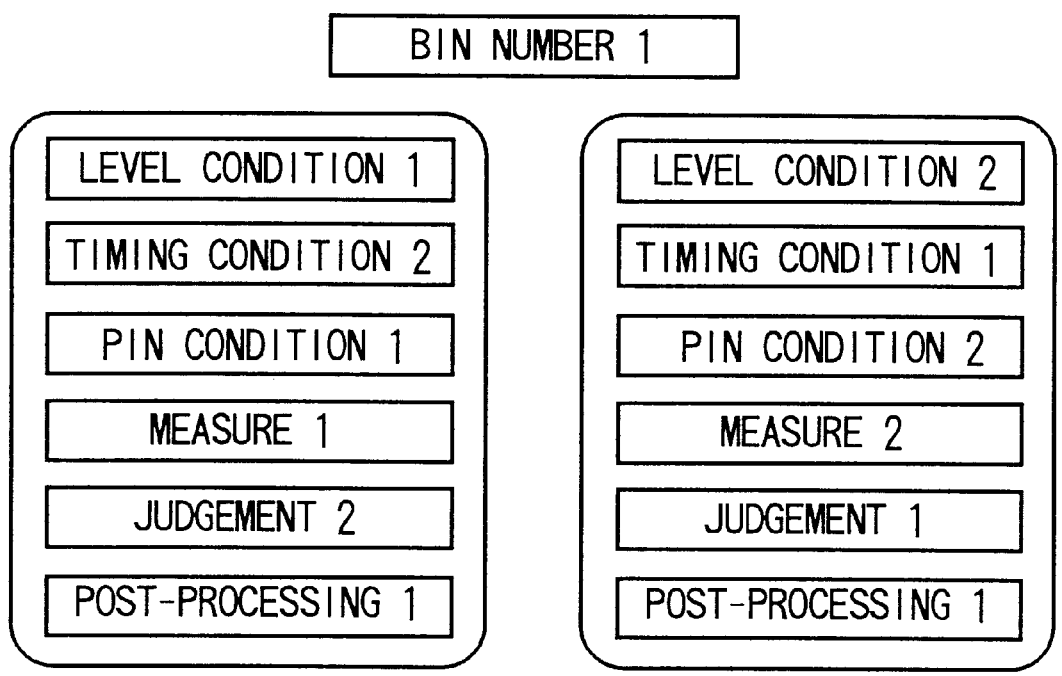
FIG. 4 is a diagram showing processes of making the test program at process of making a test program 1

The CPU 1 takes out BIN number setting statement from the test module A and the test module B. Since the BIN number setting statement of the test module A and the test module B are both BIN Number 1, the CPU 1 extracts BIN Numbers 1 as shown in FIG. 3. The CPU 1 thereafter deletes one of the extracted BIN Numbers 1 as shown in FIG. 4.

The CPU 1 takes out level condition setting statement, i.e., the next test statement, from the test module A and the test module B from which the BIN number setting statements were removed. Since the level condition setting statement of the test module A and the test module B are different from each other, the CPU 1 stops organizing the test statements of the test module A and the test module B.

Figure 5:
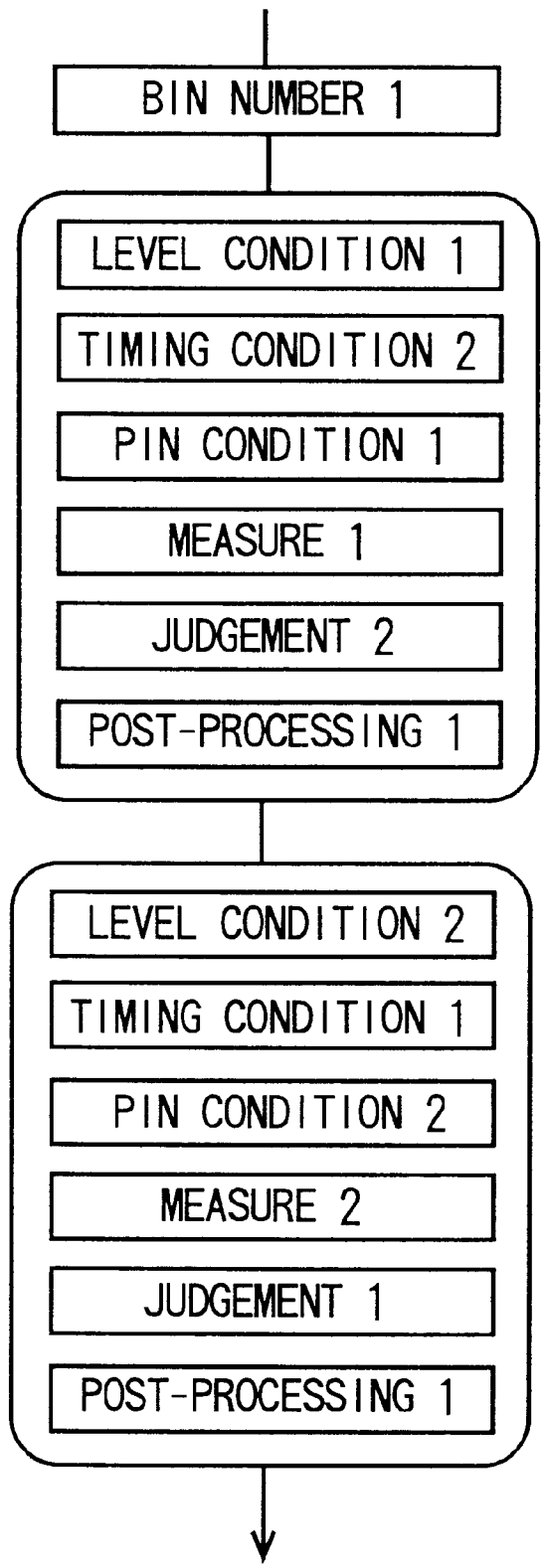
FIG. 5 is a diagram showing processes of making the test program at process of making a test program 1

The CPU 1 makes a test program by sequentially arranging, as shown in FIG. 5, Bin Number 1, the statements other than Bin Number 1 of the test module A and the statements other than Bin Number 1 of the test module B so that these statements will be executed in order.

Process Of Making A Test Program 2

Figure 6:
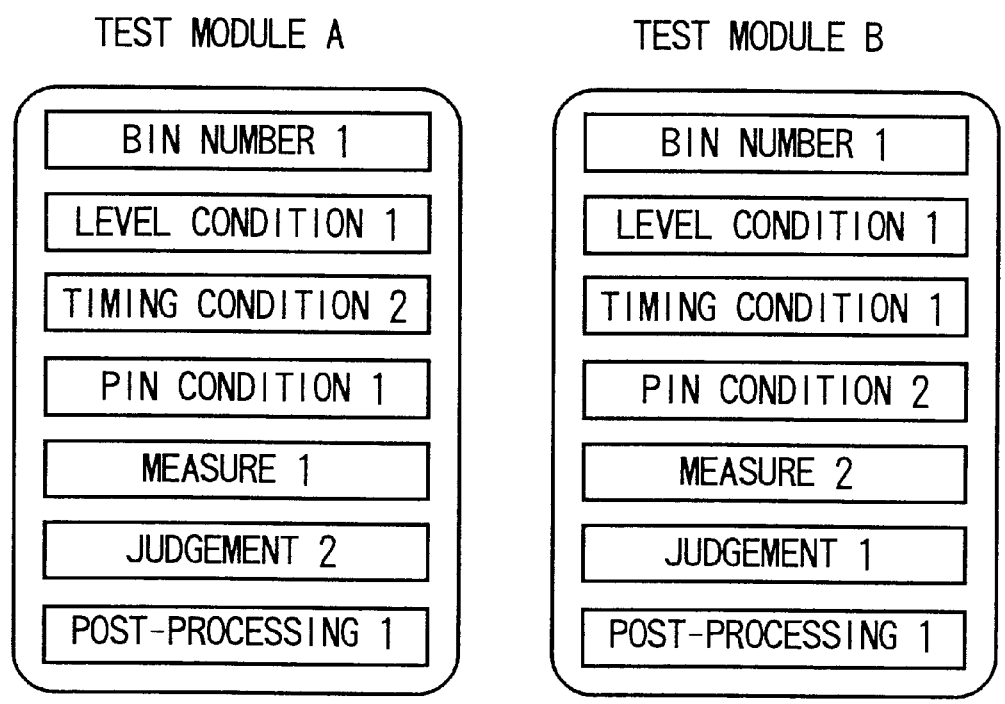
FIG. 6 is a diagram showing a test module containing a plurality of test statements as it is at process of making a test program 2.

A description will be given on a case where a test module A and a test module B which are made by an operator and stored in the third memory 8 are as shown in FIG. 6.

The test module A includes BIN Number 1, Level Condition 1, Timing Condition 2, Pin condition 1, Measure 1, Judgement 2, and Post-Processing 1. The test module B includes BIN Number 1, Level Condition 1, Timing Condition 1, Pin Condition 2, Measure 2, Judgement 1, and Post-Processing 1.

Figure 7:
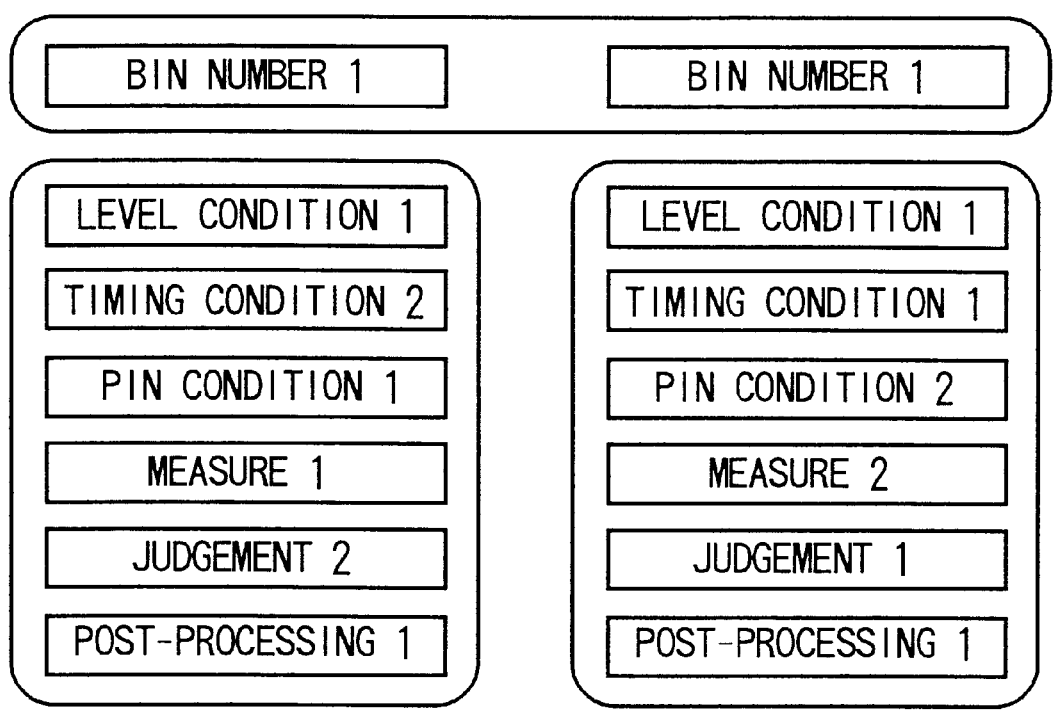
FIG. 7 is a diagram showing processes of making the test program at process of making a test program 2.
Figure 8:
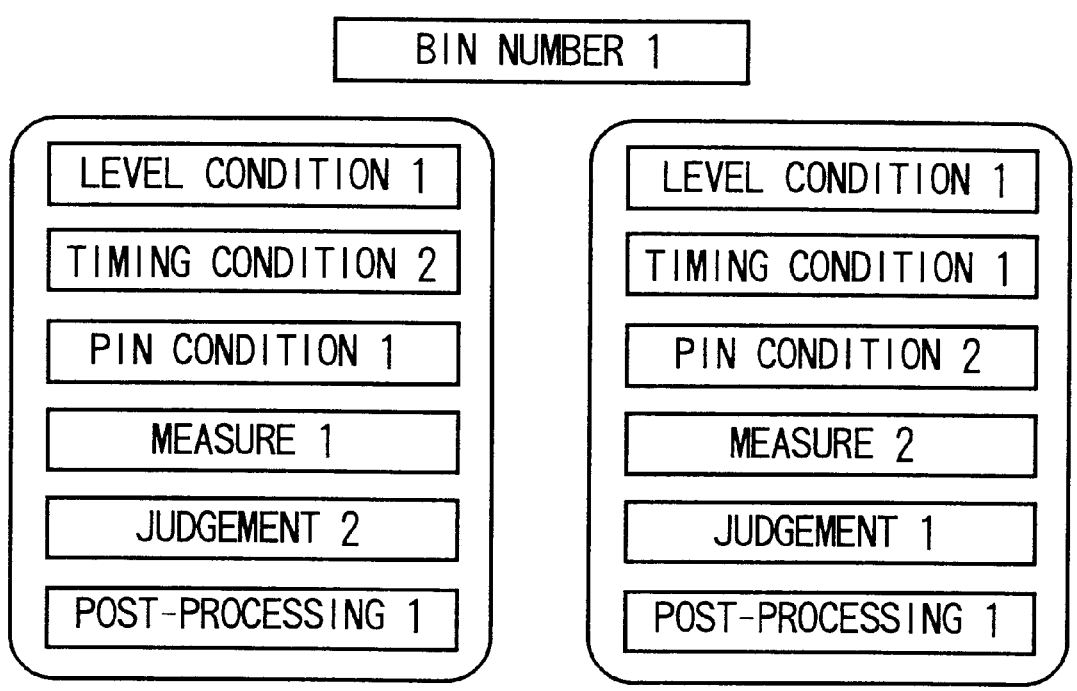
FIG. 8 is a diagram showing processes of making the test program at process of making a test program 2.

The CPU 1 takes out BIN number setting statement from the test module A and the test module B. Since the BIN number setting statement of the test module A and the test module B are both BIN Number 1, the CPU 1 extracts BIN Numbers 1 as shown in FIG. 7. The CPU 1 thereafter deletes one of the extracted BIN Numbers 1 as shown in FIG. 8.

Figure 9:
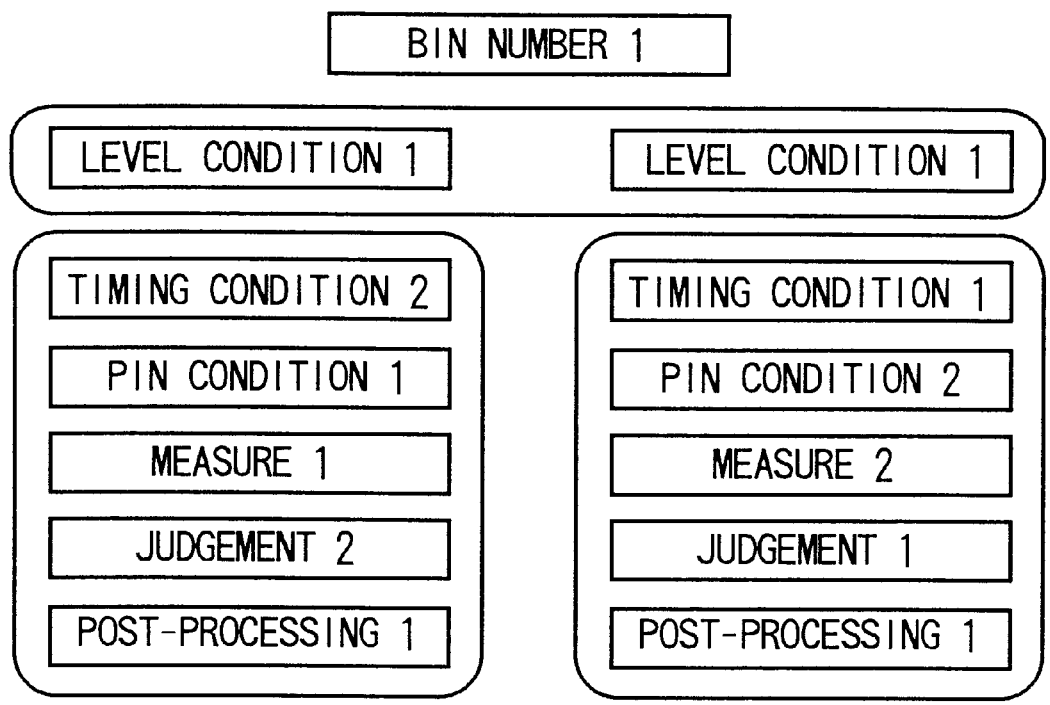
FIG. 9 is a diagram showing processes of making the test program at process of making a test program 2.
Figure 10:
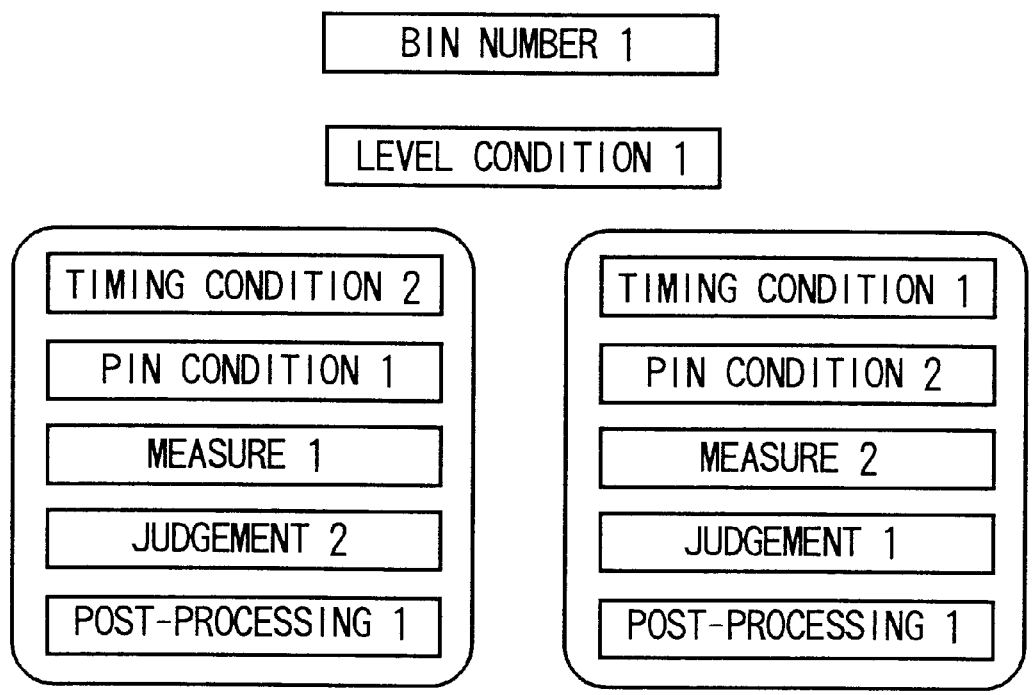
FIG. 10 is a diagram showing processes of making the test program at process of making a test program 2.

The CPU 1 takes out level condition setting statement which are next statement from the test module A and the test module B from which the BIN number setting statement were removed. Since the level condition setting statement of the test module A and the test module B are both Level Condition 1, the CPU 1 extracts Level Condition 1 as shown in FIG. 9. The CPU 1 thereafter deletes one of the extracted Level Conditions 1 as shown in FIG. 10.

The CPU 1 takes out timing condition setting statement which are next statement from the test module A and the test module B from which the level condition setting statement were removed. Since the timing condition setting statement of the test module A and the test module B are different from each other, the CPU 1 stops organizing the test statements of the test module A and the test module B.

Figure 11:
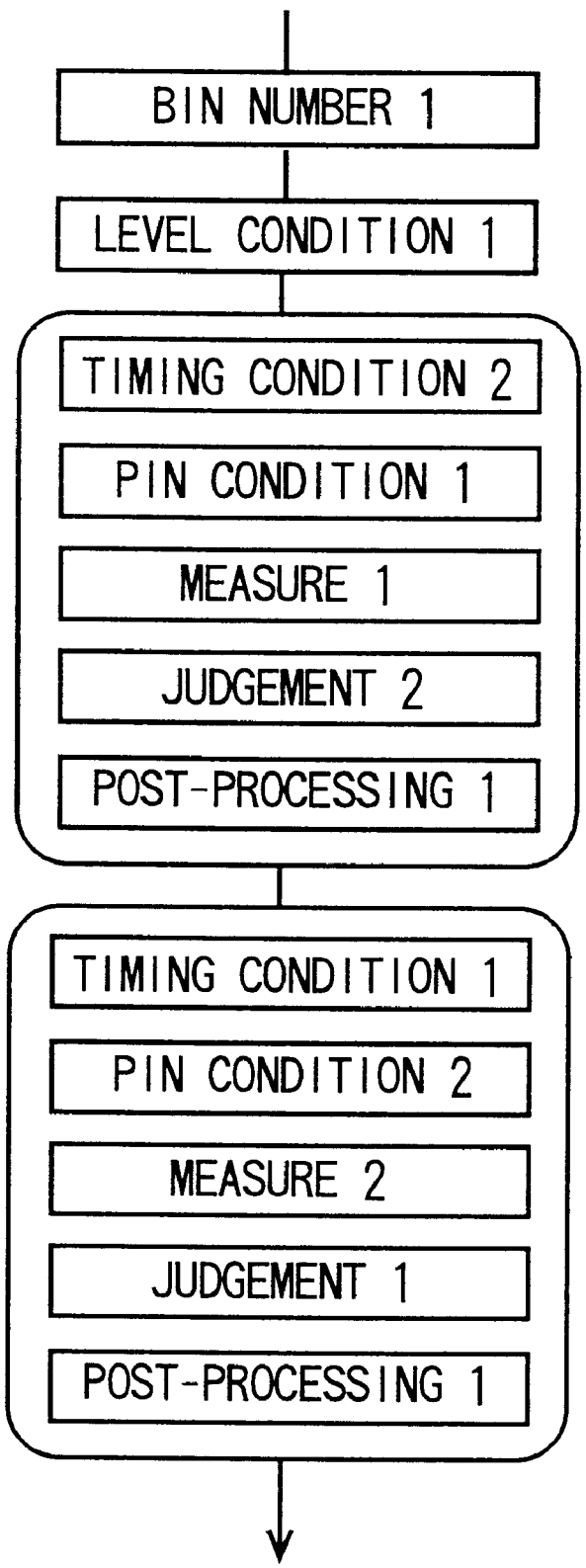
FIG. 11 is a diagram showing processes of making the test program at process of making a test program 2.

The CPU 1 makes a test program by sequentially arranging, as shown in FIG. 11, Bin Number 1, Level Condition 1, the statements other than Bin Number 1 and Level Condition 1 of the test module A and the statements other than Bin Number 1 and Level Condition 1 of the test module B so that these statements will be executed in order.

Process Of Making A Test Program 3

Figure 12:
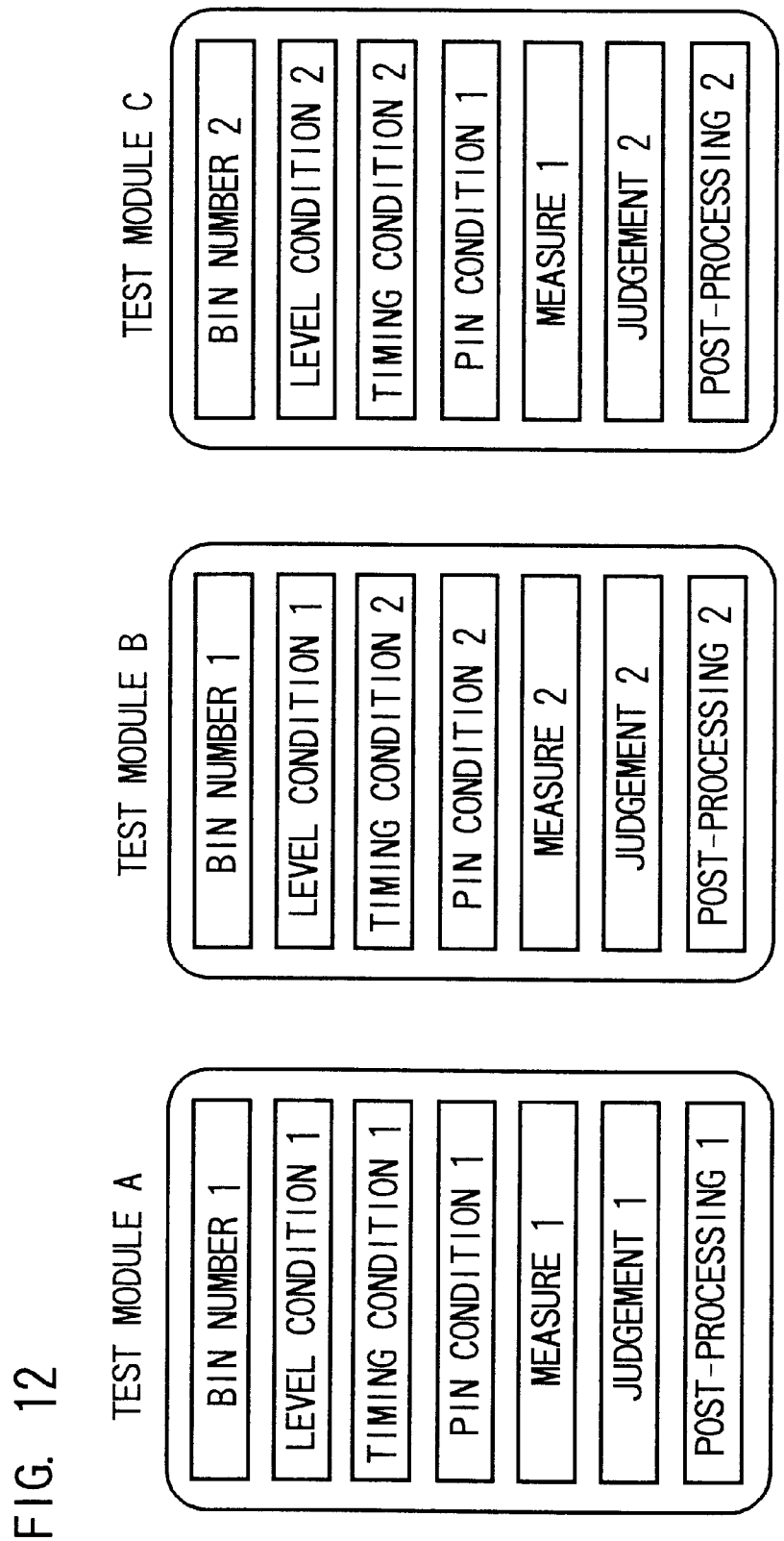
FIG. 12 is a diagram showing a test module containing a plurality of test statements as it is at process of making a test program 3.

A description will be given on a case where a test module A, a test module B and a test module C which are made by an operator and stored in the third memory 8 are as shown in FIG. 12.

The test module A includes BIN Number 1, Level Condition 1, Timing Condition 1, Pin Condition 1, Measure 1, Judgement 1, and Post-Processing 1. The test module B includes BIN Number 1, Level Condition 1, Timing Condition 2, Pin Condition 2, Measure 2, Judgement 2, and Post-Processing 2. The test module C includes BIN Number 2, Level Condition 2, Timing Condition 2, Pin Condition 1, Measure 1, Judgement 2, and Post-Processing 2. BIN Number 2 is the BIN number setting statement.

Figure 13:
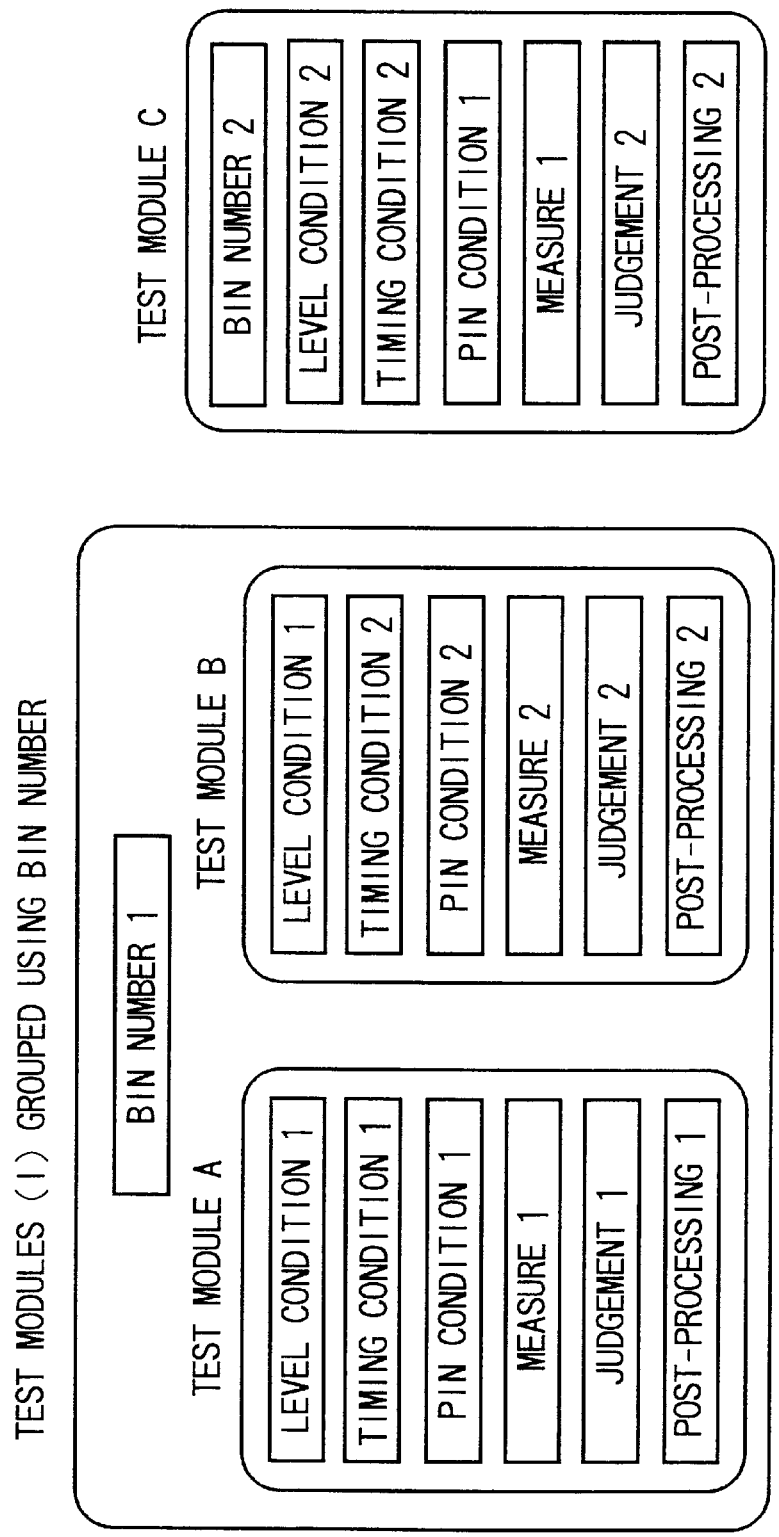
FIG. 13 is a diagram showing processes of making the test program at process of making a test program 3.
Figure 14:
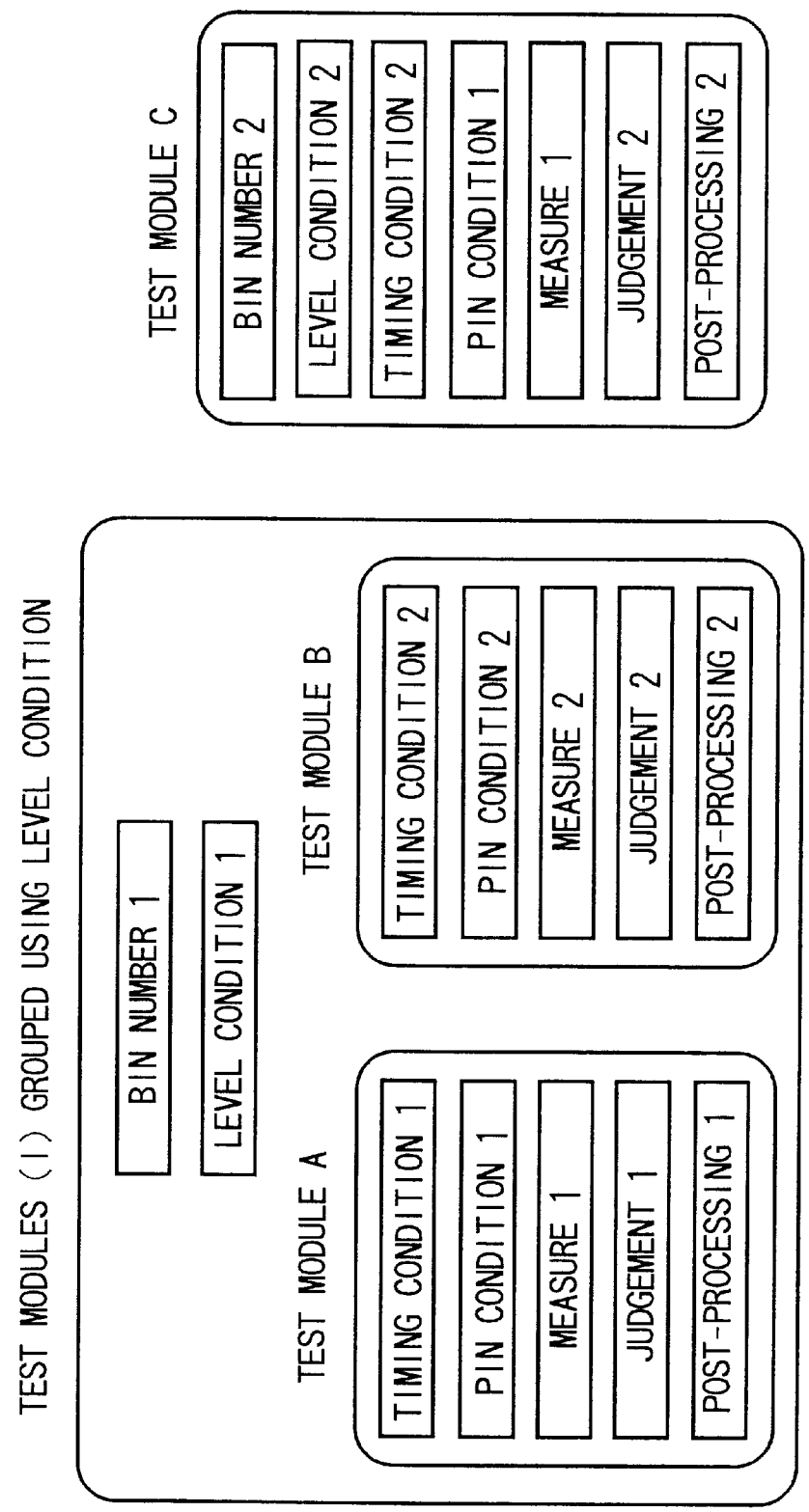
FIG. 14 is a diagram showing processes of making the test program at process of making a test program 3.

The CPU 1 takes out BIN number setting statement from the test module A, the test module B and the test module C. The BIN number setting statement of the test module A and the test module B are identical with each other and the BIN number setting statement of the test module C alone is different. As shown in FIG. 13, the CPU 1 groups the test module A and the test module B into one group, extracts BIN Number 1 of the test module A and the test module B, and deletes one of the extracted BIN Number 1.

The CPU 1 takes out level condition setting statement from the test module A and the test module B which are grouped. Since the level condition setting statement of the test module A and the test module B are the same, the CPU 1 extracts Level Condition 1. The CPU 1 thereafter deletes one of the extracted Level Condition 1 as shown in FIG. 13.

The CPU 1 takes out timing condition setting statement which are next statement from the test module A and the test module B which are grouped. Since the timing condition setting statement of the test module A and the test module B are different from each other, the CPU 1 stops organizing the test statements of the test modules.

Figure 15:
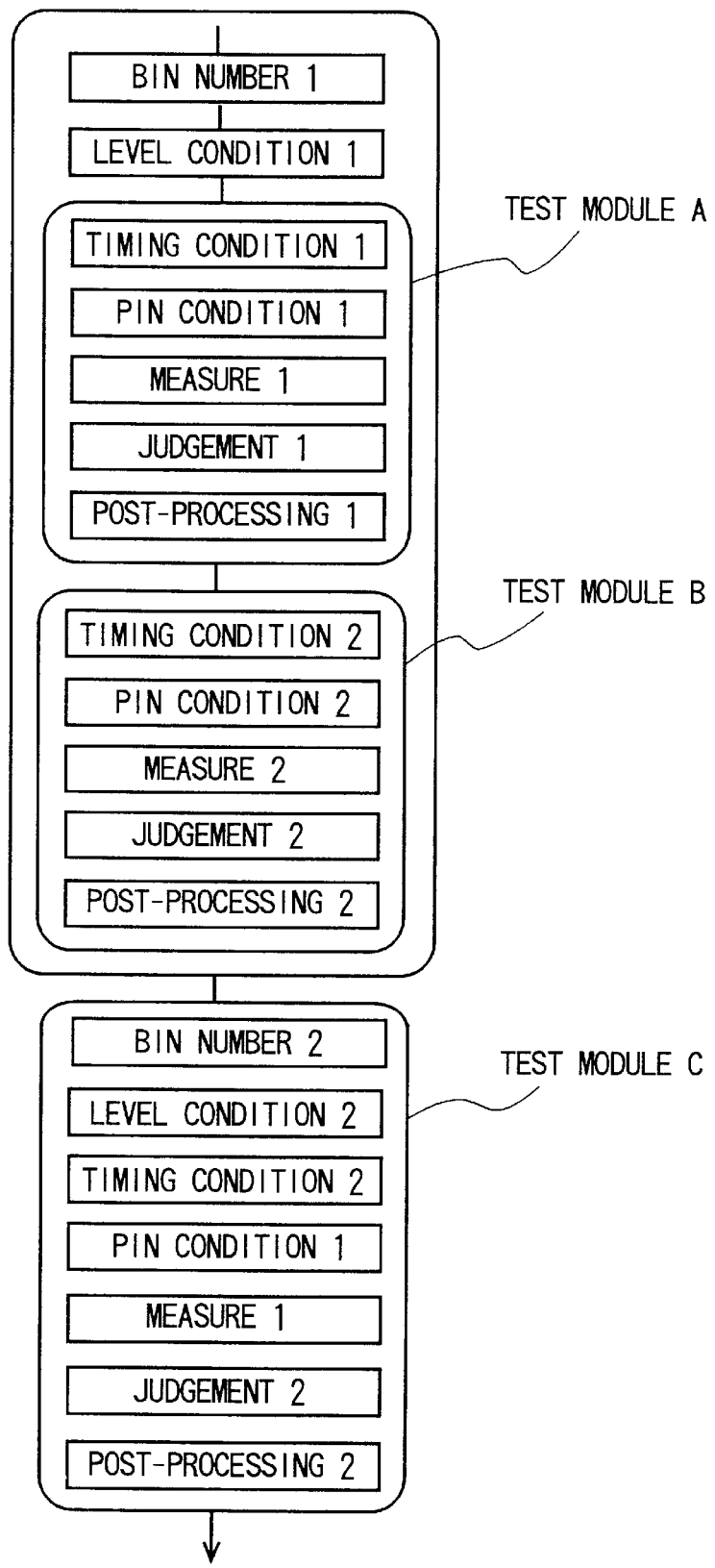
FIG. 15 is a diagram showing processes of making the test program at process of making a test program 3.

The CPU 1 makes a test program by sequentially arranging, as shown in FIG. 15, Bin Number 1, Level Condition 1, the statements other than Bin Number 1 and Level Condition 1 of the test module A, the statements other than Bin Number 1 and Level Condition 1 of the test module B and the statements of the test module C so that these statements will be executed in order.

In the foregoing examples, although the present invention has been described by providing the pin condition setting statement between the timing condition setting statement and the measurement statement, the present invention is not limited to such configuration. Various statements may be combined together, for example, a further inclusion of a pattern program in addition to the above-mentioned pin condition setting statement.

Method For Producing A Test Program

Figure 16:
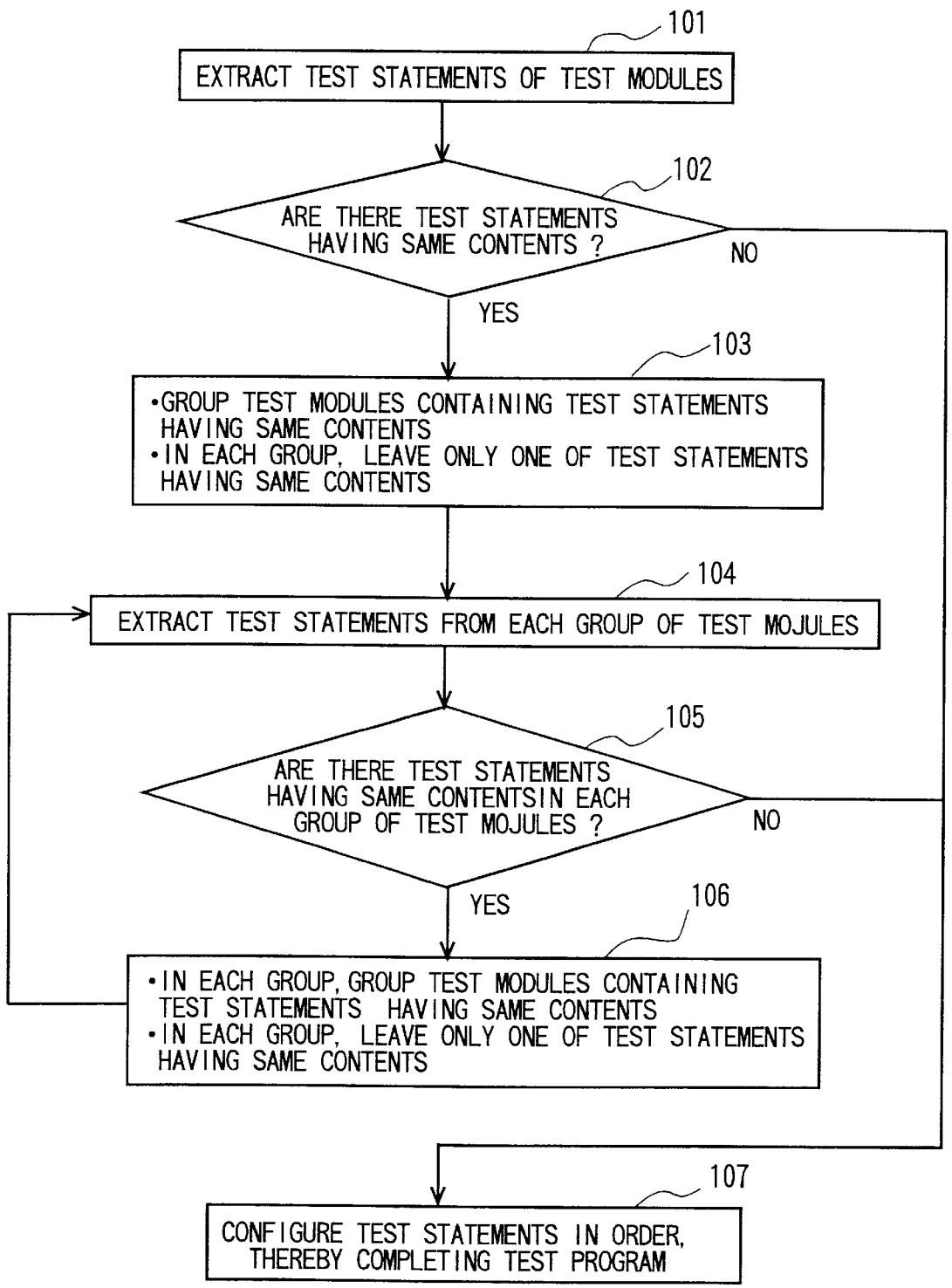
FIG. 16 is a flow chart showing processes of making a test program in accordance with a method for producing a test program.

A description will be given on a case where an operator makes a plurality of test modules and each test module includes a plurality of test statements, referring to the flow chart in FIG. 16.

In the following, a process of making a test program will be elucidated along the sequence shown in the flow chart.

STEP 101: The CPU 1 takes out test statements which are configured at the top in the respective test modules. The STEP 102 is then executed.

STEP 102: The CPU 1 judges whether there are test statements which have the same contents. When there are test statements which have the same contents, the STEP 103 is then executed. Conversely, when there are not test statements which have the same contents, the STEP 107 is then executed.

STEP 103: The CPU 1 groups test modules which contain test statements which have the same contents. In the test statements which are grouped, only one of test statements which have the same contents is left. The STEP 104 is then executed.

STEP 104: The CPU 1 takes out next test statement from the test modules which are grouped. The STEP 105 is then executed.

STEP 105: The CPU 1 judges whether there are test statements having the same contents in each group. When there are test statements which have the same contents, the STEP 106 is then executed. Conversely, when there are not test statements which have the same contents, the STEP 107 is then executed.

STEP 106: The CPU 1 further groups the grouped test modules which contain test statement which have the same contents. In each test modules which are further grouped, only one of test statements which have the same contents is left. The STEP 104 is then executed.

STEP 107: The CPU 1 makes a test program by sequentially arranging, as shown in FIGS. 5, 11 and 15, the remaining test statements in an order out of the test statements of the respective test modules.

As described above, when there are test statements which are common, a test program in which test statements are executed a small number of times is made. Hence, a time which is needed for functional tests of a semiconductor device is shortened.

In Embodiment 1, when functions of mass-produced semiconductor devices are to be tested, the higher the reject rate for a particular test module, the earlier the test is executed in the test program. In this manner, when functions of a number semiconductor devices are to be tested, it is possible to reduce a total time which is needed for functional tests of the semiconductor devices. For example, when functions of semiconductor devices of a certain lot are tested, a reject rate of the semiconductor devices is different among test modules. A computer sets so that the functions of the semiconductor devices are tested in the order of higher reject rates with respect to the test modules. In subsequent functional tests of the semiconductor devices, the functions of the semiconductor devices are tested while following test items which are automatically set by the computer.

Embodiment 2

The procedures which are stored in the first memory of Embodiment 1 are realized by means of a program, and the program is recorded in a floppy disk. In this manner, using a computer system which is not connected in a network or the like, it is possible to test functions of a semiconductor device.

Figure 17A:
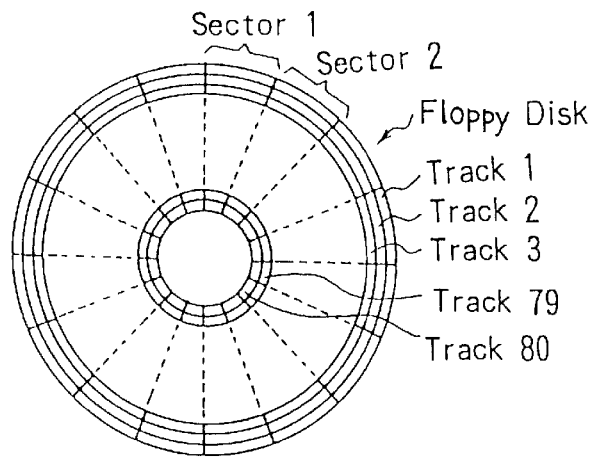
FIG. 17A is a diagram schematically showing a recording medium.
Figure 17B:
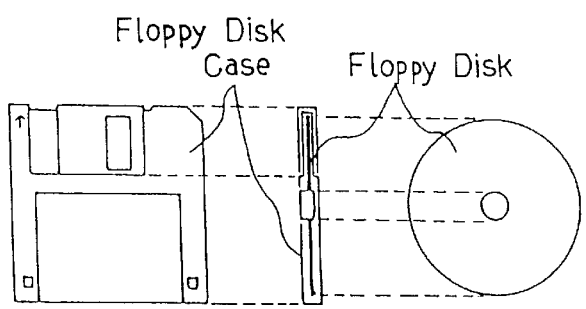
FIGS. 17B is a diagram schematically showing a recording medium.
Figure 17C:
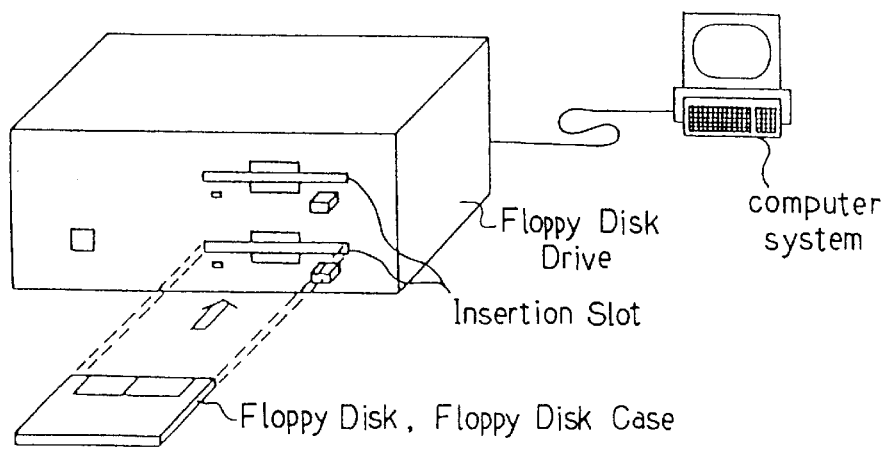
FIGS. 17C is a diagram schematically showing a computer system.
Figure 18:
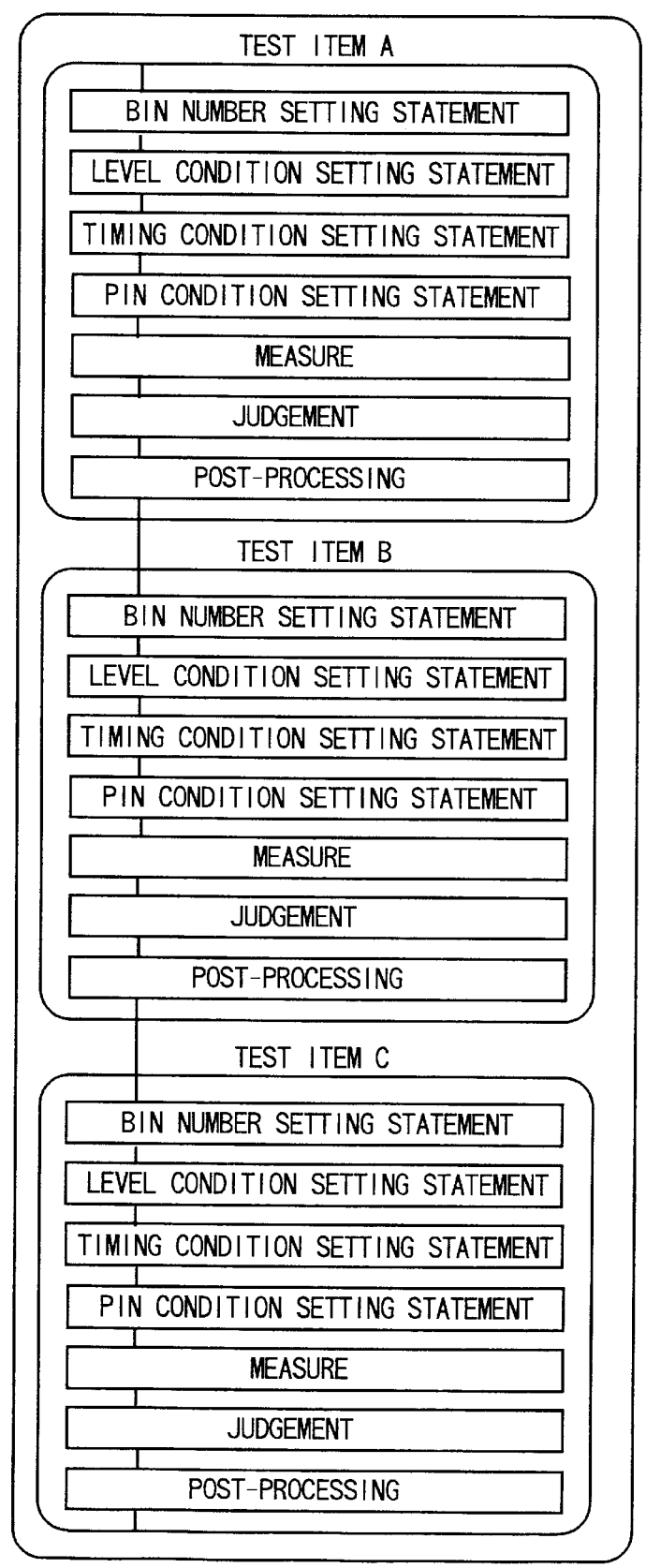
FIG. 18 is a diagram showing a conventional test program.

A floppy disk and a computer system will be elucidated referring FIGS. 17A to 17C.

FIG. 17A is a diagram showing an example of a physical format of a floppy disk. Tracks which are arranged concentrically from an outer periphery toward an inner periphery are divided into sixteen sectors, whereby the physical format is formed. A program is stored in accordance with a memory area which is divided in this manner.

FIG. 17B is a diagram describing a floppy disk case which contains a floppy disk. From the left-hand side, FIG. 17B shows a front view and a cross sectional view of the floppy disk case and a front view of the floppy disk.

Since the floppy disk is contained in floppy disk case in this fashion, the floppy disk can be safely transported while protecting the floppy disk against dust and external impact.

FIG. 17C is a diagram describing a computer system and the like for recording the program in the floppy disk and reproducing the program from the floppy disk.

The floppy disk is inserted into and removed from an insertion slot of a floppy disk drive. In the case of recording of the program in the floppy disk, the floppy disk drive records the program from the computer system into the floppy disk. In the case of reproducing of the program from the floppy disk, the floppy disk drive reads the program from the floppy disk and transfers the program to the computer system. Thus, connecting the floppy disk drive to the computer system makes it possible to record the program in the floppy disk and reproduce the program from the floppy disk. Hence, using the computer system which is not connected in a network or the like, it is possible to test functions of a semiconductor device.

Although Embodiment 2 is related to a case where a recording medium is a floppy disk, the present invention is also applicable to a case where a recording medium is an optical disk. In addition, the present invention is applicable to any recording medium, such as an IC card and a ROM cassette, which can record a test program.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

We claim:

1. A method for producing a test program for a semiconductor device comprising the steps of:

providing a plurality of test items in an original order, each test item including a plurality of test statements;

first extracting from each of said plurality of test items a first test statement which is common to each of said plurality of test items; and making a test program by sequentially arranging the first test statement and a remainder of non-extracted test statements in a predetermined order.

2. The method for producing a test program for a semiconductor device of claim 1, further comprising the step of:

second extracting from each of said plurality of test items a second test statement which is common to each of said plurality of test items wherein the second extracted test statement is different from the first extracted test statement.

3. A method for producing a test program for a semiconductor device comprising the steps of:

providing a plurality of test items in an original order, each test item including a plurality of test statements;

first grouping test items which contain a first common test statement into a first group;

first extracting said first common test statement from each of said test items in said first group; and making a test program by sequentially arranging said first common test statement, a remainder of non-extracted test statements in said first group, and test statements from test items not in said first group in a predetermined order.

4. The method for producing a test program for a semiconductor device of claim 3 further comprising the steps of:

determining if each of said first grouping test items contain a second common test statement;

second extracting said second common test statement from each of said first grouping test items.

5. A method for producing a test program for a semiconductor device comprising the steps of:

providing a plurality of test items in an original order, each test item including a plurality of test statements;

extracting from each of said plurality of test items a first test statement which is common to each of said plurality of test items; and making a test program by sequentially arranging the first test statement and a remainder of non-extracted test statements in a predetermined order.

6. A method for producing a test program for a semiconductor device comprising the steps of:

providing a plurality of test items in an original order, each test items including a plurality of test statements;

grouping test items which contain a first common test statement into a first group;

extracting said first common test statement from each of said test items in said first group; and making a test program by sequentially arranging said first common test statement, a remainder of non-extracted test statements in said first group, and test statements from test items not in said first group in a predetermined order.

7. The method for producing a test program for a semiconductor device of claim 1, wherein:

said steps of first extracting and making a test program are performed by a processor.

8. The method for producing a test program for a semiconductor device of claim 1, wherein:

said predetermined order includes the following: first, said first extracted test statement and then a remainder of non-extracted test statements in the original order within said test items.

9. The method of producing a test program for a semiconductor device of claim 1, wherein: said original order of said test items is based on device reject rates.

10. The method for producing a test program for a semiconductor device of claim 3, wherein:

said predetermined order includes the following:

first, said first common test statement;

second, a remainder of non-extracted test statements in said first group in the original order within said test items; and third, the test statements from test items not in said first group in the original order within said test items.

11. The method of producing a test program for a semiconductor device of claim 1, wherein:

the plurality of test items has a first number of test statements, the test program has a second number of test statements, and the first number is greater than the second number.

12. The method of producing a test program for a semiconductor device of claim 1 further comprising the step of:

running said test program.

13. The method for producing a test program for a semiconductor device of claim 3, wherein:

the plurality of test items has a first number of test statements, the test program has a second number of test statements, and the first number is greater than the second number.

14. The method of producing a test program for a semiconductor device of claim 3 further comprising the steps of:

running the first extracted test statement within said test program, and running the remainder of non-extracted test statements.

15. The method of producing a test program for a semiconductor device of claim 5, wherein:

the plurality of test items has a first number of test statements, the test program has a second number of test statements, and the first number is greater than the second number.

16. The method of producing a test program for a semiconductor device of claim 5 further comprising the step of:

running said test program.

17. The method of producing a test program for a semiconductor device of claim 6, wherein:

the plurality of test items has a first number of test statements, the test program has a second number of test statements, and the first number is greater than the second number.

18. The method of producing a test program for a semiconductor device of claim 6 further comprising the steps of:

running the first extracted test statement within said test program, and running the remainder of non-extracted test statements.

* * * * *